United States Patent
Kapusta et al.

[19]

[11] Patent Number: 5,848,285
[45] Date of Patent: Dec. 8, 1998

[54] MACROCELL HAVING A DUAL PURPOSE INPUT REGISTER FOR USE IN A LOGIC DEVICE

[75] Inventors: Richard L. Kapusta, San Jose; Christopher W. Jones, Pleasanton, both of Calif.

[73] Assignee: Cypress Semiconductor Corporation, San Jose, Calif.

[21] Appl. No.: 578,094

[22] Filed: Dec. 26, 1995

[51] Int. Cl.⁶ .................................................. G06F 15/76
[52] U.S. Cl. ........................................ 395/800.01; 326/39
[58] Field of Search ............................. 395/800.01, 899; 340/825.83; 326/39

[56] References Cited

U.S. PATENT DOCUMENTS

| | | | |
|---|---|---|---|
| 4,750,149 | 6/1988 | Miller | 364/900 |
| 4,758,746 | 7/1988 | Birkner et al. | 307/465 |
| 4,771,285 | 9/1988 | Agrawal et al. | 340/825.83 |
| 4,942,318 | 7/1990 | Kawana | 307/465 |
| 4,963,770 | 10/1990 | Keida | 307/465 |
| 5,023,484 | 6/1991 | Pathak et al. | 307/465 |
| 5,027,011 | 6/1991 | Steele | 307/465 |
| 5,053,646 | 10/1991 | Higuchi | 307/465 |
| 5,175,819 | 12/1992 | Le Ngoc et al. | 395/250 |
| 5,185,706 | 2/1993 | Agrawal et al. | 364/489 |
| 5,220,213 | 6/1993 | Chan et al. | 307/465 |
| 5,231,588 | 7/1993 | Agrawal et al. | 364/489 |
| 5,282,164 | 1/1994 | Kawana | 365/189.12 |
| 5,329,460 | 7/1994 | Agrawal et al. | 364/489 |
| 5,426,378 | 6/1995 | Ong | 326/39 |
| 5,594,366 | 1/1997 | Khong | 340/825.87 |

*Primary Examiner*—Eric Coleman
*Attorney, Agent, or Firm*—Blakely, Sokoloff, Taylor & Zafman LLP

[57] ABSTRACT

The macrocell is configured to allow a single register to be employed either as a register for storing internal macrocell product terms (or logical combinatorial thereof) or as an input register for directly storing signals received from an input/output pin. One embodiment of the macrocell, described herein, includes the register and the input/output pin, along with three two-to-one multiplexers and an output enable logic unit. Feedback lines are also provided. The components are interconnected and appropriate multiplexer and output enable selection signals are provided to allow the macrocell to input and output a variety of combinations of signals including combinatorial and registered logic signals, buried combinatorial and buried registered logic signals, and input and output signals. In one exemplary mode, the macrocell is controlled to store an input signal in the register with the output signal of this register routed to one of the feedback lines while also providing a buried combinatorial feedback path from the macrocell logic line input onto another of the feedback lines. Contents of the register may be output from the macrocell to the input/output pin or fedback along one of the feedback lines to other components of a device containing the macrocell such as a programmable interconnect matrix of a complex programmable logic device. Method and apparatus embodiments of the invention are provided.

20 Claims, 6 Drawing Sheets

MACROCELL HAVING A DUAL PURPOSE INPUT REGISTER FOR USE IN A LOGIC DEVICE

BACKGROUND OF THE INVENTION

1. Field of the Invention

The invention generally relates to logic devices such as complex programmable logic devices (CPLDs) and in particular to macrocells for use within such logic devices.

2. Description of Related Art

A CPLD is one example of a logic device employing a macrocell. A CPLD is a programmable logic device capable of performing fairly sophisticated logic calculations by manipulating various product terms. Macrocells are employed within the CPLD provide circuitry for performing logic operations on the product terms received from the product term allocator and circuitry for routing the resulting signals either as combinatorial or registered signals. The logic operations performed by the macrocells include, for example, summing the product terms or routing the product terms through XOR gates and the like.

One exemplary CPLD configuration includes a set of logic blocks interconnected by a programmable interconnect matrix (PIM). Each logic block includes a product term array, a product term allocator, and a set of macrocells. The PIM, the product term arrays and product term allocators of the various logic blocks are electrically erasable and programmable, typically by flash programming techniques, for use in performing specific logic calculations directed to a particular application such as the filtering of digital signals or the manipulation of computer graphics data. Each macrocell typically includes, as its principal components, a single register, an input/output pin, an output enable device, a selection multiplexer and one or more feedback paths. Typically, the macrocell is configured to operate either as an input pin with a buried registered or combinatorial signal path or as an input and output pin with a registered or combinatorial signal path. The selection multiplexer and the output enable device control the operation of the macrocell. Other typical components include a clock multiplexer for selecting a clock signal for docking the register and an output enable multiplexer for selecting an output enable signal for controlling the output enable device. Macrocells may also include a polarity multiplexer for selecting the polarity, i.e., the true or complement, of logic signals routed by the macrocell.

FIG. 1 illustrates an exemplary macrocell 10 used in the 37X family of CPLD devices provided by Cypress Semiconductor, the assignee of rights to the present application. Macrocell 10 includes a single register 12 receiving input product terms from a product term allocator (not shown) through an OR gate 14 connected along a macrocell logic input line 16. Line 16 and an output of register 12 are connected to a multiplexer 18. For combinatorial signal routing, multiplexer 18 selects product term logic signals directly from line 16. For registered signal routing, multiplexer 18 selects the output of register 12 which is then routed onto a first feedback path 22 for feedback to a PIM (also not shown). A second multiplexer 20 also receives the output of multiplexer 18 and selects the polarity of the resulting signal for output through an output enable device 24 to an input/output pin 26. An input or second feedback line 28 is connected from between output enable unit 24 and input/output pin 26 to the PIM. A multiplexer 30 provides signals for controlling output enable unit 24. Another multiplexer 32 selects a single clocking signal, from a group of four input clocking signals, for clocking register 12.

With this configuration, macrocell 10 operates as follows. With the output enable set to off, input/output path 26 operates only as an input path with a combinatorial input signal transmitted along line 28 to the PIM. The remaining portions of the macrocell operate as a buried macrocell for routing either a combinatorial signal or a registered signal received along line 16 to the PIM along feedback path 22. Multiplexer 18 is controlled to select whether the feedback is combinatorial or registered.

With the output enable set on, pin 26 operates as both an input and an output pin with output signals being provided through output enable unit 24 either from line 16 directly or from register 12. Again, multiplexer 18 controls whether output enable unit 24 receives a combinatorial signal or a registered signal. Feedback path 22 feeds back either the combinatorial or registered signal. Path 28 routes signals at pin 26 to the PIM.

With its various signal paths and multiplexers, the macrocell of FIG. 1 provides considerable flexibility for routing either combinatorial or registered signals and for handling input and output. However, even greater flexibility would be advantageous. In particular, the macrocell of FIG. 1 is not capable of directly registering an input signal received from pin 26 within register 12. Rather, to register such an input signal, the signal must be routed along line 28 to the PIM, then rerouted either back to the same macrocell or to another macrocell of the CPLD. In either case, the set up time for registering an input signal may be fairly long.

One proposed implementation for allowing an input signal to be directly registered is to provide a second storage register within each macrocell. Although such an implementation avoids the set up time problem noted above, the implementation requires an additional register within each macrocell, which thereby requires greater chip resources. Moreover, the provision of two registers per macrocell may be wasteful, particularly for those applications which do not require the registering of input signals.

Accordingly, it would be desirable to provide an improved macrocell arrangement which is capable of registering an input signal with minimal set up time yet which does not require the provision of an additional register within the macrocell while also maintaining the simultaneous use of the logical combination of product terms performed within the macrocell. It is to that end that aspects of the invention are primarily drawn.

SUMMARY OF THE INVENTION

An improved macrocell is provided having a single dual-purpose register configured for use as either an input register or a register for storing internal product term logic signals for buried or non-buried registered signal path routing. Circuitry for routing combinatorial signals is also provided. The macrocell, with only a single register, is capable of operating as either a dedicated input register with a buried combinatorial signal path, an input pin with a buried register or buried combinatorial signal path, or an input/output pin with a registered or combinatorial signal path.

In accordance with an exemplary embodiment, the macrocell includes the aforementioned single register, an input/output pin and an output enable control unit connected between an output of the register and the input/output pin. First, second and third multiplexers are provided for controlling the routing of signals within the macrocell. The first multiplexer has a first input connected to the input/output pin, a second input connected to a macrocell logic input of the macrocell, and an output connected to an input of the register. Signals provided along the macrocell logic input may represent logical combinations of product terms. The second multiplexer has a first input connected to the macrocell logic input, a second input connected to an output of the register, and an output connected to the output enable control unit. The third multiplexer has a first input connected to the macrocell logic input, a second input connected to the input/output pin and an output connected to a first feedback line. A second feedback line is connected between the output of the second multiplexer and the output enable control unit. The first and third multiplexers are both controlled by a first selection signal and the second multiplexer is controlled by a second selection signal. The output enable control unit is controlled by an output selection signal.

With this configuration, a wide variety of routing modes or paths may be selected including a mode wherein an input signal is routed from the input/output pin, through the second multiplexer, into the register while a combinatorial logic signal is simultaneously routed from the input logic line through the third multiplexer onto the first feedback line. In other words, in that mode, the macrocell operates to simultaneously register an input signal and provide a buried combinatorial feedback path. The registering of the input signal is achieved without significant set up time because the signal is merely transmitted from the input/output pin, through the first multiplexer, and into the register. In another mode, the macrocell may be controlled to route internal logic signals through the second multiplexer into the register while simultaneously routing input signals from the input/output pin through the third multiplexer onto the first feedback line. Signals stored in the register may thereafter be fed back along the second feedback line or output to the input/output pin. In that mode, the macrocell operates simultaneously as a non-registered input pin and as a buried registered signal path. In yet another mode, the macrocell may be controlled to route combinatorial, registered or latched signals either to the input/output pin or to one or more feedback lines, or both.

Thus, the macrocell, with only single register, is capable of providing a wide variety of signal routing modes including a mode wherein the cell operates as a dedicated input register and a buried combinatorial signal path. The flexibility is achieved without requiring significant chip resources. Indeed, as compared to the macrocells described above in the Background of the Invention section, the macrocell of the invention requires only two additional 2:1 multiplexers, a single additional selection signal, and two relatively short additional signal paths. Accordingly, a significant improvement in flexibility and functionality is achieved with a relatively modest increase in chip resources. Importantly, the macrocell allows input signals to be registered with minimal set up time, without requiring an additional register. This registering of the input signal is provided via an extra path into the macrocell beyond those conventionally provided. The extra path allows the macrocell to provide the dual uses, i.e., registered and combinatorial uses. In this regard, when operated to register input signals received from an input/output pin, macrocell logic input signals may also be processed by the macrocell and routed along the combinatorial feedback path.

The improved macrocell is advantageously implemented within a CPLD of a type having a central PIM and a set of logic blocks each having a set of macrocells. All, or only a portion, of the macrocells of the CPLD may be configured in accordance with the invention. Principles of the invention may also be applicable within macrocells of other logic devices such as PLDs, field programmable gate arrays (FPGAs) and programmable application specific integrated circuits (pASICs).

DETAILED DESCRIPTION OF EXEMPLARY EMBODIMENTS OF THE INVENTION

With reference to FIGS. 2–6, exemplary embodiments of the invention will now be described. The exemplary embodiments are primarily described with reference to block diagrams and schematic diagrams. As to the block diagrams, it should be appreciated that not all components necessary for a complete implementation of the invention are necessarily illustrated or described in detail. Rather, only those components necessary for a thorough understanding of the invention are illustrated and will be described. Furthermore, components which are either conventional or may be readily designed and fabricated in accordance with the teachings provided herein are also not described in detail.

Figure 1:
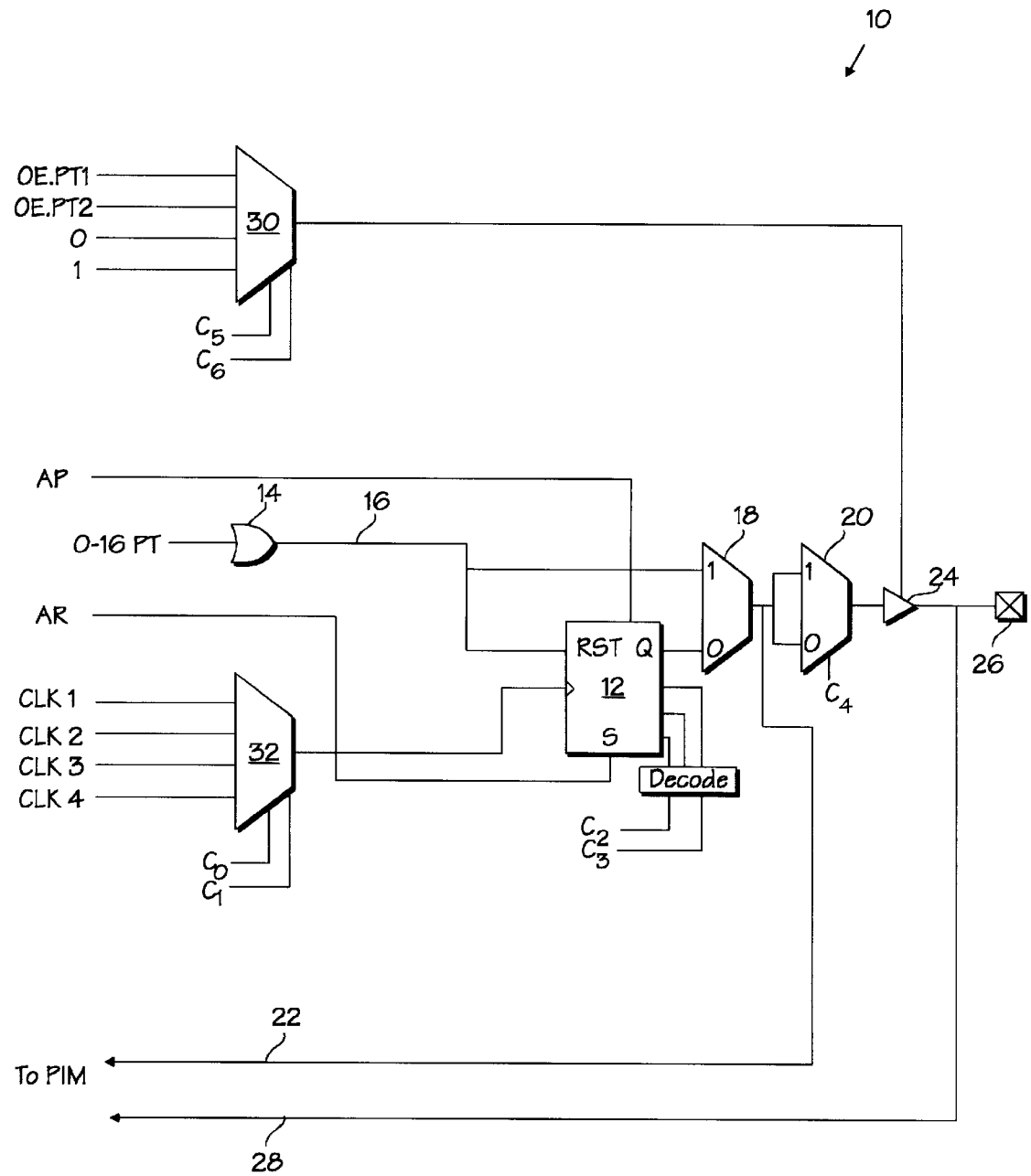
FIG. 1 is a schematic illustration of a macrocell configured in accordance with the prior art and capable of operating either as input pin with a buried registered or buried combinatorial signal path or as an input/output pin with a registered or combinatorial signal path.
Figure 2:
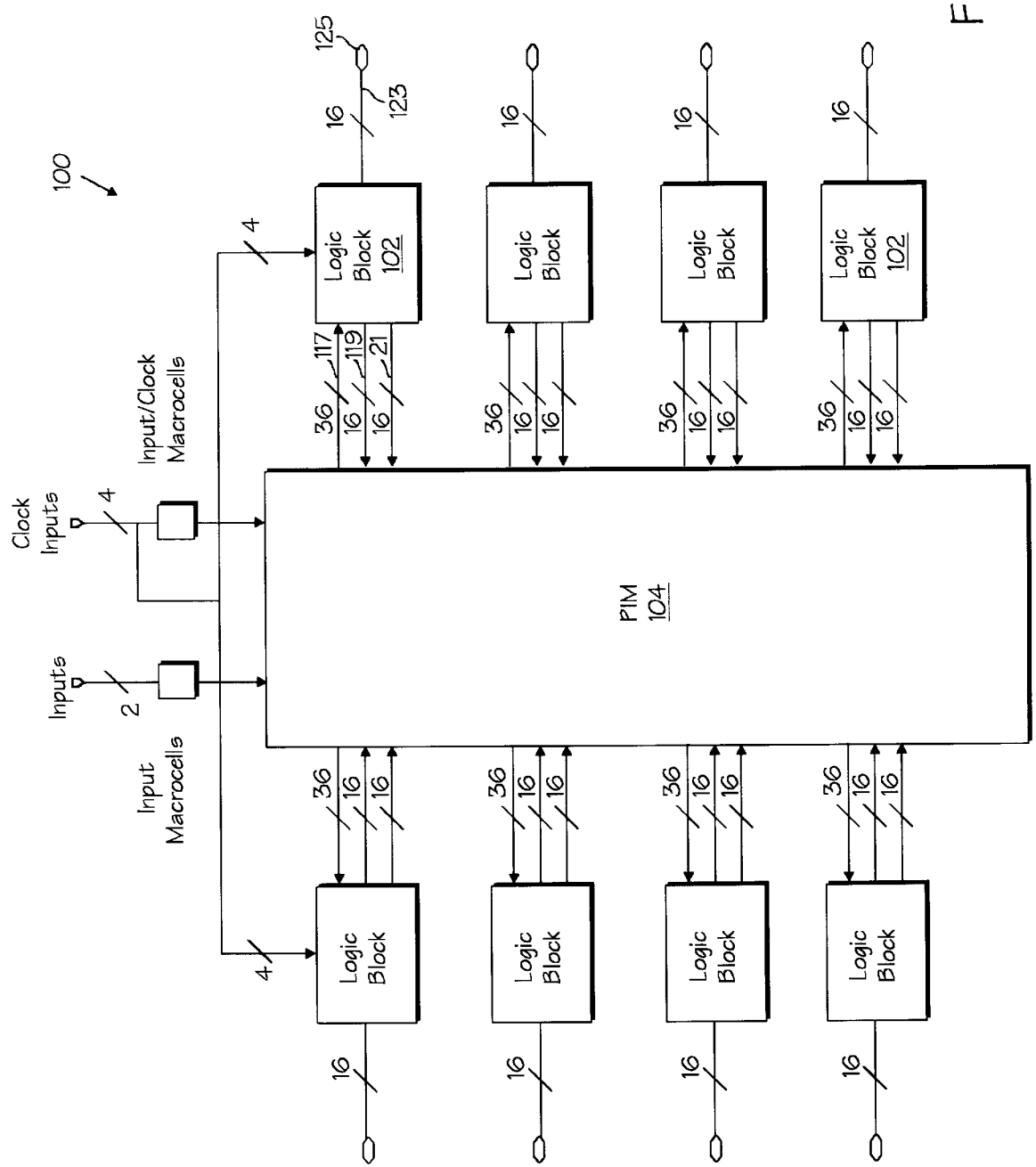
FIG. 2 is a block diagram of an exemplary CPLD configured in accordance with the invention.

FIG. 2 illustrates a CPLD 100 including a plurality of logic blocks 102 each connected to a central PIM 104. Each of logic blocks 102 includes a set of programmable logic elements which can be programmed, perhaps by flash programming techniques, to perform a wide variety of product term calculations. CPLD 100 also includes input signal lines, input clock lines, input macrocells and input/clock macrocells, which are not pertinent to the invention and will not be described.

Each logic block receives signals from the PIM over a bus line 117 and transmits signals to the PIM over separate bus lines 119 and 121. An additional bus line 123 interconnects each logic block with a corresponding input/output pin 125. In one implementation, bus 117 has a width of 36 and buses 119, 121 and 123 have widths of 16.

Figure 3:
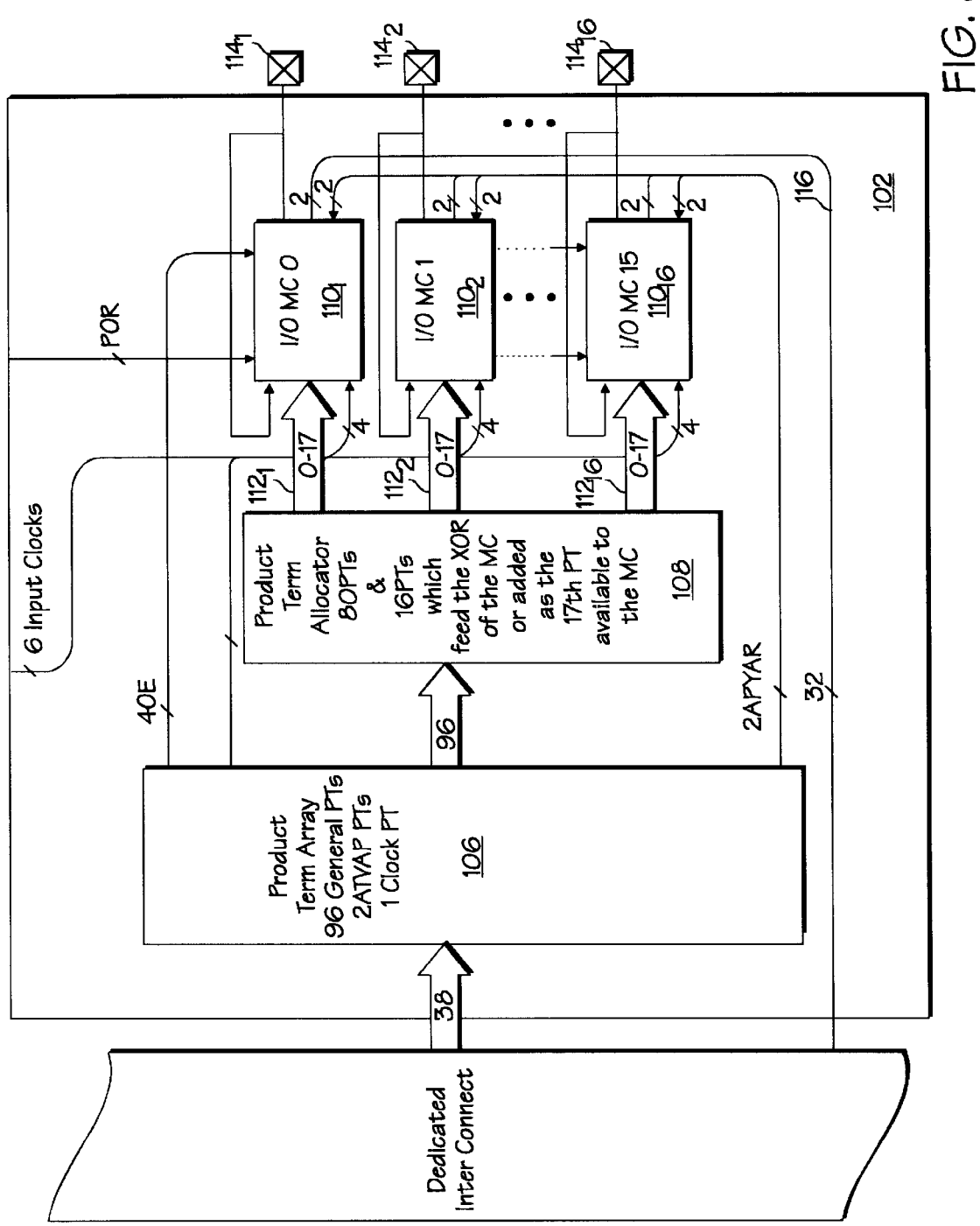
FIG. 3 is a block diagram of a single logic block of the CPLD of FIG. 2.

FIG. 3 illustrates an exemplary one of the logic blocks 102. Logic block 102 includes a product term array 106, a product term allocator 108 and a set of macrocells $110_1$–$110_{16}$. In other embodiments, more or fewer macrocells may be employed. Each macrocell is connected, by bus lines $112_1$–$112_{16}$, respectively, to outputs of product term allocator 108 for receiving product terms therefrom. Each macrocell is also connected to a respective input/output pin $114_1$–$114_{16}$, respectively. Each macrocell is also connected, via a feedback path 116 to PIM 104, a portion of which is shown. Logic block 102 also includes other interconnection lines, such as clock lines, which are not pertinent to the invention and will not be further described.

Prior to use, the macrocell is programmed to perform selected logic operations using product terms in accordance with a particular application. In this regard, the PIM and the product term arrays and the product term allocators of the various logic blocks are programmed to collectively perform the appropriate calculations. The various macrocells of the logic blocks are employed for performing additional logic operations on the product terms received from the product term allocator and for routing the results back to the PIM or to the input/output pins for further processing. The logic operations performed by the macrocells may include, for example, summing product terms or routing product terms through XOR gates and the like. Operations performed by the macrocells may also include the use of a register or a latch for storing signals. The macrocells also handle input and output through the respective I/O pins connected thereto. Thus, macrocells generally perform logic operations, routing operations and storage operations on internal product term signals or input/output signals. The operation of the various macrocells is controlled by selection signals which may be generated internally or externally and which may be based upon programmed components.

Figure 4:
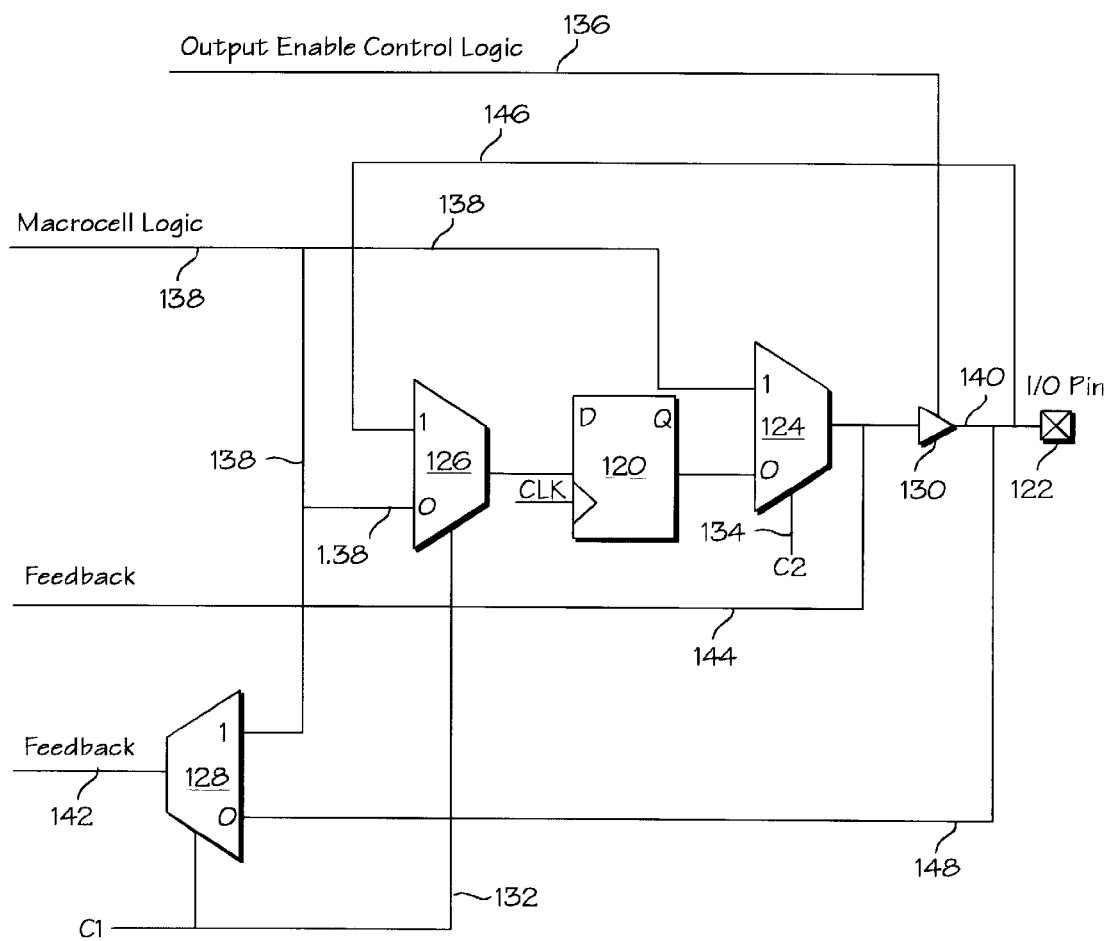
FIG. 4 illustrates a macrocell configured in accordance with the invention additionally capable of operating as a dedicated input register with a buried combinatorial signal path.

FIG. 4 illustrates a simplified example of a macrocell of the invention. Not all components of a practical macrocell are illustrated. Rather, only those components necessary for understanding the invention are set forth.

Macrocell 110 of FIG. 4 includes a register 120, an input/output pin 122, three multiplexers 124, 126 and 128 and an output enable control unit 130, connected as shown. Multiplexers 126 and 128 are both controlled by a single selection signal C1 provided along a selection line 132. Multiplexer 124 is controlled by a separate selection signal C2 provided along line a 134. Output enable control unit 130 is controlled by an output enable control signal OE provided along a line 136. Input to the macrocell is provided by macrocell logic input line 138 and line 140 connected to I/O pin 122. Input, regardless of the source, is typically in the form of product terms, or the like. Herein, input received along line 138 is generally referred to as macrocell logic signals and input received from I/O pin 122 is typically referred to as input signals. Output from the macrocell is provided by I/O pin 122 or by first and second feedback lines 142 and 144, respectively.

The multiplexers and connection lines of macrocell 110 are interconnected with the other components to allow the macrocell to operate as either a dedicated input register with a buried combinatorial signal path, an input pin with a buried registered or buried combinatorial signal path, or an input/output pin with a registered or combinatorial signal path. More specifically, multiplexer 126 is configured to provide register 120 either with macrocell logic signals along lines 138 or input signals along line 146. Multiplexer 124 is connected directly to input macrocell logic line 138 and to an output of register 120. As such, multiplexer 124 controls whether combinatorial or registered signals are routed to control logic unit 130 and to feedback line 144. The control logic unit controls whether the registered or combinatorial signals are also passed to the I/O pin and to feedback line 148. Finally, multiplexer 128, which is connected to feedback line 148 and also to macrocell logic input line 138, controls whether feedback line 142 receives a combinatorial signal or an input signal. Multiplexers 126 and 128 are both controlled by a single selection signal C1. If C1 is set to one, register 120 receives an input signal along line 146 and feedback line 142 receives an internal macrocell logic signal along line 138. If C1 is set to zero, register 120 receives the internal macrocell logic signal from line 138 and feedback line 142 receives the signal provided along line 148 which, depending upon the operation of multiplexer 124 and control logic unit 130, may be a combinatorial logic signal, a register logic signal or an input signal.

Thus, signals output from the macrocell through the pair of feedback lines and the I/O pin are controlled by three selection signals, C1, C2 and OE. Hence, a total of eight possible combinations of operating modes are provided. Table I, below, identifies the output signals provided on the pair of feedback lines and the I/O pin for each of the eight combinations of the selection signals.

TABLE I

| C1 | C2 | OE | Result |
|---|---|---|---|
| 0 | 0 | on | Feedback line 144 receives registered macrocell-logic signal |
|  |  |  | Feedback line 142 receives registered macrocell-logic signal |
|  |  |  | I/O pin receives registered macrocell-logic signal as outout |
| 0 | 1 | on | Feedback line 144 receives combinatorial macrocell-logic signal |
|  |  |  | Feedback line 142 receives combinatorial macrocell-logic signal |
|  |  |  | I/O pin receives combinatorial macrocell-logic signal as output |
| 1 | 0 | on | Feedback line 144 receives value of register 120 |
|  |  |  | Feedback line 142 receives combinatorial macrocell-logic signal |
|  |  |  | I/O pin receives value of register 120 |
| 1 | 1 | on | Feedback line 144 receives combinatorial macrocell-logic signal |
|  |  |  | Feedback line 142 receives combinatorial macrocell-logic signal |
|  |  |  | I/O pin receives combinatorial macrocell-logic as output |
| 0 | 0 | off | Feedback line 144 receives registered macrocell-logic signal |
|  |  |  | Feedback line 142 receives combinatorial I/O pin signal |
|  |  |  | I/O pin provides a combinatorial input signal |
| 0 | 1 | off | Feedback line 144 receives registered I/O pin |
|  |  |  | Feedback line 142 receives combinatorial I/O pin signal |
|  |  |  | I/O pin provides a combinatorial input signal |
| 1 | 0 | off | Feedback line 144 receives registered I/O pin |
|  |  |  | Feedback line 142 receives combinatorial macrocell-logic signal |
|  |  |  | I/O pin provides a registered input |
| 1 | 1 | off | Feedback line 144 receives combinatorial macrocell-logic signal |
|  |  |  | Feedback line 142 receives combinatorial macrocell-logic signal |
|  |  |  | I/O pin is not used (buried configuration only) |

Thus, eight modes of operation are specified using the three selection signals C1, C2 and OE and substantial flexibility is thereby achieved in choosing combinations of signal paths. In other implementations, it may be desirable to control multiplexers 126 and 128 by separate selection signals to provide still further combinations of signal paths. However, such requires additional chip resources for specifying and routing the additional selection signal.

Of the eight modes illustrated in Table I, of particular interest is the mode wherein C1 is 1, C2 is 0 and OE is off. In that mode, the I/O pin is used to provide a registered input pin signal. With the input from pin 122 routed along line 146 into register 120. Registering of the input signal is achieved with minimal set up time since the signal is only transmitted along line 146 and through multiplexer 126 to register 120. This is in contrast with a conventional CPLD arrangement wherein the registering of an input signal requires that the signal be routed into a PIM, or similar, then rerouted to a macrocell for registering. The use of the macrocell of the invention as an input register is also achieved with only a single register in the macrocell. This is in contrast with other conventional arrangements which require a separate register within each macrocell for separately registering an input signal. Hence, efficiency and flexibility is achieved without requiring substantial additional resources.

In the mode wherein an input from the I/O pin is registered (i.e., when C1 is 1, C2 is 0 and OE is off), feedback line 142 receives a combinatorial macrocell logic signal and feedback line 144 receives a registered I/O pin input signal. An alternative embodiment, described below, is provided wherein both feedback lines 142 and 144 receive a registered I/O pin signal for the same mode of operation.

Figure 5:
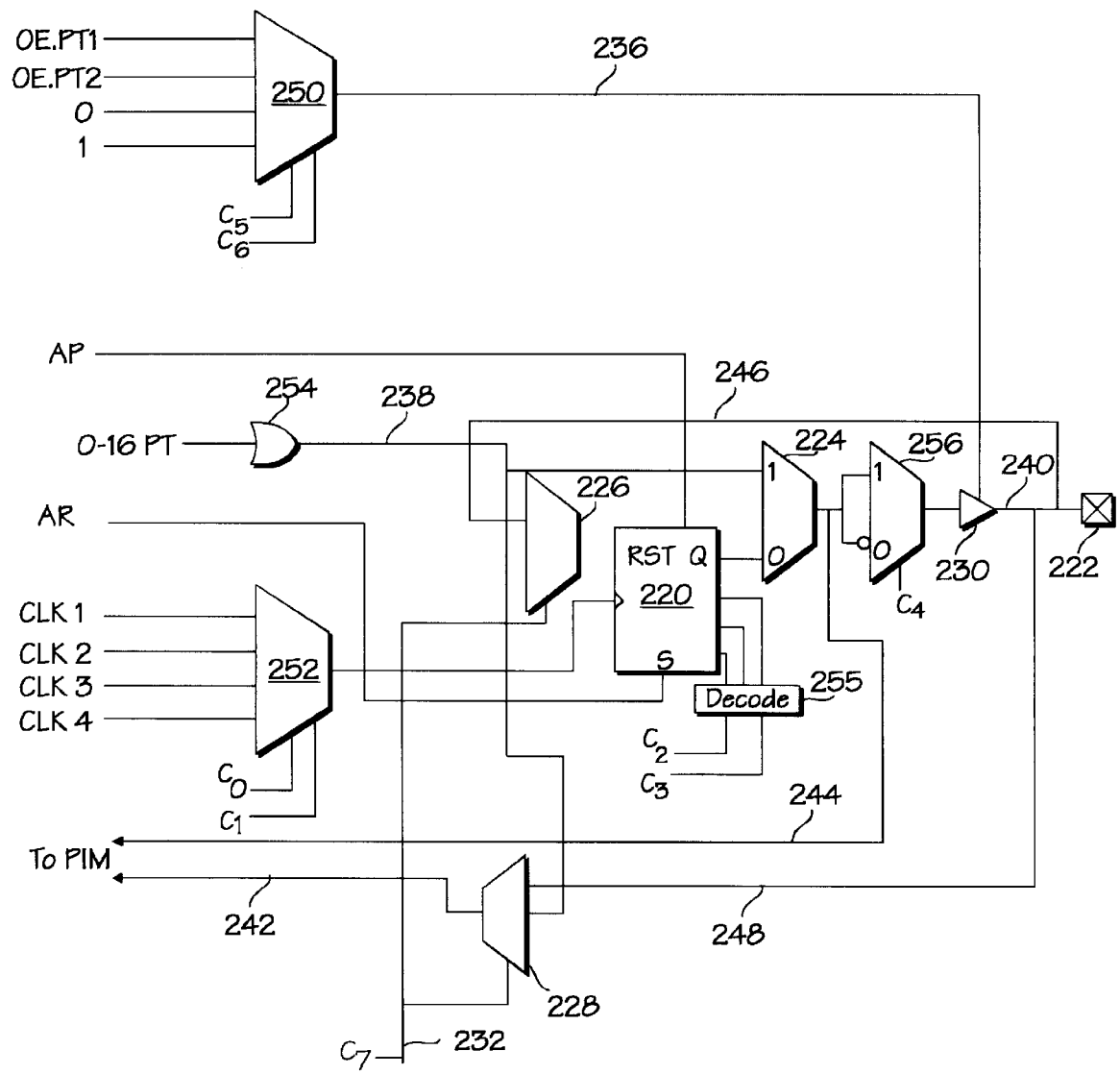
FIG. 5 illustrates a practical implementation of the macrocell of FIG. 4.

As noted, FIG. 4 illustrates a simplified implementation of a macrocell. FIG. 5 illustrates a practical implementation including additional components provided, for example, for selecting appropriate clock signals, output enable signals, and the like. The macrocell of FIG. 5 is similar to that of FIG. 4 and like components are identified with like reference numerals incremented by 100 and such components will not be redescribed. Additional components include an output enable selection multiplexer 250, a clock selection multiplexer 252, an OR gate 254, a polarity multiplexer 256 and a decode unit 258. Output enable multiplexer 250 selects a single output enable signal from a pair of product term output enable signals, logic 0 and logic 1. The output enable signal selected by multiplexer 250 is transmitted to output enable control unit 224 along line 236.

Clock multiplexer 252 selects one clock signal from among four input clock signals for use in clocking register 220. Decode unit 258 operates to control whether register 220 is a D-type edge-triggered register, a T-type edge-triggered register, or a D-type level-triggered latch along with generating the selection control signal for multiplexer 224. Polarity multiplexer 256 includes true or complement inputs connected to multiplexer 224 for selecting the true or complement of the signal provided by multiplexer 224. Finally, OR gate 254 operates to sum or add a plurality of input product terms for input along line 238 as a macrocell logic signal. In other embodiments, more complex logic gates may be provided instead of, or in addition to, OR gate 254 for performing a variety of logic operations. As with the macrocell of FIG. 4, the macrocell of FIG. 5 includes various multiplexers for routing the macrocell logic signal as either a registered or combinatorial signal or a buried registered or buried combinatorial signal. The macrocell also includes circuitry for routing an input signal to register 220 for storage therein. The operation of the macrocell and the various signals output therefrom will not be redescribed.

Figure 6:
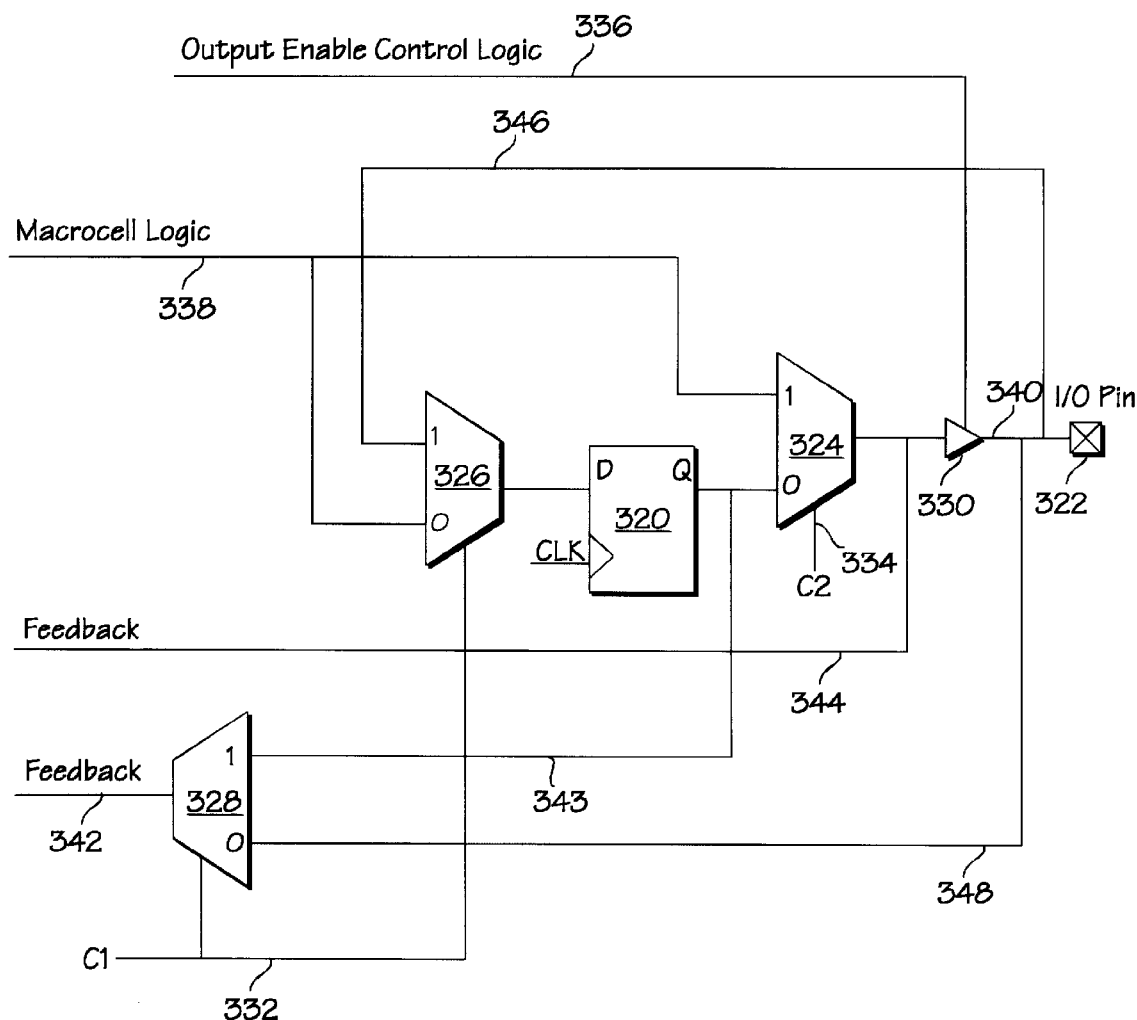
FIG. 6 illustrates a macrocell configured in accordance with an alternative embodiment of the invention capable of operating as a dedicated input pin with a buried registered signal path.

FIG. 6 illustrates an alternative embodiment of the macrocell of FIG. 4 having a slightly different internal routing arrangement. The macrocell of FIG. 6 is similar to that of FIG. 4 and like components are identified with like reference numerals incremented by 200 and such components will not be redescribed. Whereas the macrocell of FIG. 4 includes a feedback path connected directly from the macrocell logic input to one input of the multiplexer connected to feedback line 142, the arrangement of the macrocell of FIG. 6 has a feedback path 343 connected from an output of the register to the multiplexer of the feedback path. Connecting the aforementioned feedback path from an output of the register, rather than from the macrocell input line, allows feedback line 342 to output a registered signal rather than a combinatorial signal as with the embodiment of FIG. 4. Table II, below, illustrates the various signals output on the pair of feedback lines and the I/O pin for various values of selection signals C1, C2 and OE.

TABLE II

| C1 | C2 | OE | Result |
|---|---|---|---|
| 0 | 0 | on | Feedback line 344 receives registered macrocell-logic signal<br>Feedback line 342 receives registered macrocell-logic signal<br>I/O pin receives registered macrocell-logic signal as outout |
| 0 | 1 | on | Feedback line 344 receives combinatorial macrocell-logic signal<br>Feedback line 342 receives combinatorial macrocell-logic signal<br>I/O pin receives combinatorial macrocell-logic signal as output |
| 1 | 0 | on | Feedback line 344 receives value of register 320<br>Feedback line 342 receives value of register 320<br>I/O pin receives value of register |
| 1 | 1 | on | Feedback line 344 receives combinatorial macrocell-logic signal<br>Feedback line 342 receives combinatorial macrocell-logic signal<br>I/O pin receives combinatorial macrocell-logic signal as output |
| 0 | 0 | off | Feedback line 344 receives registered macrocell-logic signal<br>Feedback line 342 receives combinatorial I/O pin signal<br>I/O pin povides a combinatorial input signal |
| 0 | 1 | off | Feedback line 344 receives combinatorial macrocell-logic signal<br>Feedback line 342 receives combinatorial I/O pin signal<br>I/O pin provides a combinatorial input signal |
| 1 | 0 | off | Feedback line 344 receives registered I/O pin<br>Feedback line 342 receives registered I/O pin<br>I/O pin provides a registered input |
| 1 | 1 | off | Feedback line 344 receives combinatorial macrocell-logic signal<br>Feedback line 342 receives registered I/O pin<br>I/O pin provides a registerd input |

Table III provides a comparison of the operations of the embodiments of FIGS. 4 and 6.

TABLE III

| | | | Embodiment Shown in FIG. 4 | | Embodiment Shown in FIG. 6 | | | |
|---|---|---|---|---|---|---|---|---|
| C1 | C2 | OE | Function | | Function | C1 | C2 | OE |
| 0 | 0 | On | registered macrocell output<br>registered macrocell<br>feedback on both feedbacks<br>(software should use top<br>feedback since it is faster | This is the<br>same for both<br>embodiments | registered macrocell output<br>registered macrocell<br>feedback on both feedbacks<br>(software should use top<br>feedback since it is faster) | 0 | 0 | On |
| 0 | 1 | On | combinatorial macrocell<br>output<br>combinatorial macrocell<br>feedback on both feedbacks<br>(software should use top<br>feedback since it is faster) | This is the<br>same for both<br>embodiments | combinatorial macrocell<br>output<br>combinatorial macrocell<br>feedback on both feedbacks<br>(software should use top<br>feedback since it is faster) | 0 | 1 | On |

TABLE III-continued

| | | | Embodiment Shown in FIG. 4 | | Embodiment Shown in FIG. 6 | | | |
|---|---|---|---|---|---|---|---|---|
| C1 | C2 | OE | Function | | Function | C1 | C2 | OE |
| 1 | 0 | On | register loop with I/O pin the top feedback has the value contained in the register loop combinatorial macrocell feedback on bottom feedback (software not expected to use this) | These are different in what is fed back | register loop with I/O pin both feedbacks have the value contained in the register loop (software not expected to use this) | 1 | 0 | On |
| 1 | 1 | On | combinatorial macrocell output combinatorial macrocell feedback on both feedbacks (software could use this to provide extra routability since both feedbacks are the same speed) | These are different in what is fed back | combinatorial macrocell output combinatorial macrocell feedback on top feedback registered macrocell feedback on bottom feedback (software could use this to provide extra functionality since both combinatorial and registered versions of the macrocell logic are fed back) | 1 | 1 | On |
| 0 | 0 | Off | buried registered macrocell with I/O pin as a combinatorial input buried registered macrocell on top feedback I/O pin as combinatorial input on bottom feedback | This is the same for both embodiments | buried registered macrocell with I/O pin as a combinatorial input buried registered macrocell on top feedback I/O pin as combinatorial input on bottom feedback | 0 | 0 | off |
| 0 | 1 | Off | buried combinatorial macrocell with I/O pin as a combinatorial input buried combinatorial macrocell on top feedback I/O pin as combinatorial input on bottom feedback | This is the same for both embodiments | buried combinatorial macrocell with I/O pin as a combinatorial input buried combinatorial macrocell on top feedback I/O pin as combinatorial input on bottom feedback | 0 | 1 | Off |
| 1 | 0 | Off | buried combinatorial macrocell with I/O pin as a registered input buried combinatorial macrocell on top feedback I/O pin as registered input on bottom feedback | 1 0 Off on the left is the same as 1 1 Off on the right with the feedbacks swapped | I/O pin as a registered input I/O pin as registered input on both feedbacks (software could use this to provide extra routability since both feedbacks are the same speed) | 1 | 0 | off |
| 1 | 1 | Off | output is tri-stated buried combinatorial macrocell on both feedbacks (software could use this to provide extra routability since both feedbacks are the same speed) | 1 1 Off on the left is different from 1 0 Off on the right | buried combinatorial macrocell with I/O pin as a registered input I/O pin as registered input on top feedback buried combinatorial macrocell on bottom feedback | 1 | 1 | Off |

Table III includes, for each combination of input C1, C2 and OE, a brief description of operations software accessing the macrocells may perform. In Table III, "top" feedback refers to feedback lines 144 and 344, respectively, of FIGS. 4 and 6. "Bottom" feedback refers to feedback lines 142 and 342 of FIGS. 4 and 6, respectively. For example, for the C1 equals zero, C2 equals zero and OE equals one input combination of FIG. 4, software employing the macrocell is expected to use the top feedback path since the top feedback path is somewhat faster than the bottom feedback path. The same is true for the C1 equals zero, C2 equals zero and OE equals one input signal combination for embodiment of FIG. 6.

In considering Table III, it should be noted that first, second, fifth and sixth rows of the table describe modes of operations which are identical for the two embodiments. Moreover, the seventh row mode for embodiment of FIG. 4 provides identical functionality and performance as the eighth row mode of the embodiment of FIG. 6 and vice versa. Accordingly, the most significant differences between the two embodiments are within the modes described within rows 3 and 4. The mode of operation set forth in row 3 is not expected to be used by software. Also, it should be noted that modes described in rows 5 and 6 do not include descriptions of software operations since the modes used as described without any additional choices. The same is true for row 7 of the FIG. 4 embodiment and row 8 of the FIG. 6 embodiment. Of the eight rows set forth in Table III, five of the rows correspond to modes of operation that are particularly useful. These are rows 1, 2, 5, 6 and 7 corresponding to the embodiment of FIG. 4 and rows 1, 2, 5, 6 and 8 corresponding to the embodiment of FIG. 6. The other modes of operation may or may not be useful.

What has been described are various embodiments of a macrocell having a single register and configured to be capable of directly registering an input signal and simultaneously providing a buried combinatorial logic path. The macrocell is also capable of performing the routing functions of conventional macrocells. The macrocell is advantageously employed within CPLDs. However, principles of the invention may be exploited in other devices incorporating macrocells, or similar cells, including PLDs, FPGAs and pASICS.

Also, it should be noted that, whereas the invention has been described with respect to a macrocell having one and only one register, principles of the invention may be applicable in macrocells having more than one register. For example, macrocells, configured in accordance with the principles of the invention, may include two or more registers for use in providing more complex routing paths.

In general, the embodiments described herein are intended merely to illustrate the invention and should not be construed as limiting the scope of the invention.

What is claimed is:

1. A macrocell of a programmable logic device, comprising a register configurable to operate as:

(a) an input register for registering a signal received at a pin coupled to the macrocell and to be routed to a programmable interconnect matrix, the macrocell further comprising a combinatorial signal path for a signal received from the programmable interconnect matrix to be routed back thereto directly from the macrocell at the same time that the registered signal is routed to the programmable interconnect matrix;

(b) a register for a signal received from the programmable interconnect matrix, the macrocell further comprising a path to the programmable interconnect matrix for an input signal received at the pin in such a configuration; and (c) an output register for an output signal received from the programmable interconnect matrix to be routed to the pin, the macrocell further comprising an input signal path to the programmable interconnect matrix fro the pin in such a configuration.

2. The macrocell of claim 1 further comprising:

a first multiplexer having an output coupled to an input of the register; and a second multiplexer having a first input coupled to an output of the register and an output coupled to the pin.

3. The macrocell of claim 2 wherein a first input of the first multiplexer is coupled to the pin.

4. The macrocell of claim 2 further comprising a third multiplexer having a first input coupled to the pin and an output coupled to the programmable interconnect matrix.

5. The macrocell of claim 2 wherein a second input of the first multiplexer is coupled to the programmable interconnect matrix.

6. The macrocell of claim 5 wherein the output of the second multiplexer is further coupled to the programmable interconnect matrix.

7. A programmable logic device comprising a plurality of the macrocells of claim 1, a plurality of said pins coupled thereto, and said programmable interconnect matrix.

8. A macrocell for a logic device, comprising:

a first multiplexer selecting one of a first group of signals including a logic signal and an input/output pin signal to provide a register input signal;

a register receiving (i) said register input signal and (ii) a clock signal, said register generating a register output signal in response thereto;

an output buffer providing an enabled output signal to an input/output pin in response to (i) a first feedback signal and (ii) an enable signal, said first feedback signal being selected from a group of signals including said logic signal and said register output signal;

a first feedback path providing said first feedback signal as a first macrocell output, said first macrocell output differing from said enabled output signal; and a second feedback path comprising a second multiplexer that selects one of a third group of signals as a second macrocell output, said third group of signals including at least two of said enabled output signal, said logic signal and said register output signal, said second macrocell output differing from said enabled output signal, wherein said macrocell may be configured to simultaneously output the logic signal and the register output signal on the first and second feedback paths.

9. The macrocell of claim 8, wherein said second multiplexer selects said one of said third group of signals in response to a first control signal.

10. The macrocell of claim 9, further comprising a third multiplexer selecting one of said second group of signals in response to a second control signal to provide said first feedback signal.

11. The macrocell of claim 9, wherein said first multiplexer selects said one of said first group of signals in response to said first control signal.

12. The macrocell of claim 8, wherein said second multiplexer selects one of said logic signal and said enabled output signal as said second macrocell output.

13. The macrocell of claim 8, wherein said second multiplexer selects one of said register output signal and said enabled output signal as said second macrocell output.

14. The macrocell of claim 8, wherein said logic signal comprises a product term signal.

15. The macrocell of claim 8, wherein said first and second macrocell outputs are each coupled to a programmable interconnect matrix.

16. A logic device, comprising:

an input/output pin, a programmable interconnect matrix, and the macrocell of claim 8.

17. The logic device of claim 16, wherein said first and second macrocell outputs are each coupled to said programmable interconnect matrix.

18. The logic device of claim 16, further comprising a product term array coupled to (i) said programmable interconnect matrix and (ii) said macrocell.

19. The logic device of claim 18, further comprising a product term allocator receiving a plurality of signals from said product term array, and providing said logic signal to said first multiplexer, said logic signal comprising a product term signal.

20. The logic device of claim 16, further comprising:

a plurality of said macrocells, each of which is coupled to said programmable interconnect matrix via said first and second macrocell outputs; and a plurality of said input/output pins, each of which is coupled to a unique one of said macrocells.

* * * * *